(12) United States Patent
Romonovich et al.

(10) Patent No.: US 6,787,504 B2
(45) Date of Patent: Sep. 7, 2004

(54) MGB2 SINGLE CRYSTAL AND ITS PRODUCTION METHOD, AND SUPERCONDUCTIVE MATERIAL CONTAINING MGB2 SINGLE CRYSTAL

(75) Inventors: Lee Sergey Romonovich, Tokyo (JP); Ayako Yamamoto, Tokyo (JP); Setsuko Tajima, Tokyo (JP)

(73) Assignee: International Superconductivity Technology Center, The Juridicial Foundation, Tokyo (JP)

( * ) Notice: Subject to any disclaimer, the term of this patent is extended or adjusted under 35 U.S.C. 154(b) by 58 days.

(21) Appl. No.: 10/333,827

(22) PCT Filed: May 21, 2002

(86) PCT No.: PCT/JP02/04880

§ 371 (c)(1),
(2), (4) Date: Jan. 23, 2003

(87) PCT Pub. No.: WO02/095093

PCT Pub. Date: Nov. 28, 2002

(65) Prior Publication Data

US 2003/0146417 A1 Aug. 7, 2003

(30) Foreign Application Priority Data

May 23, 2001 (JP) ........................................ 2001-154581

(51) Int. Cl.[7] .......................... H01L 39/24; H01R 43/00; B22F 3/00
(52) U.S. Cl. ............................. 505/100; 29/599; 29/825; 148/96; 148/514; 505/230; 505/450
(58) Field of Search .................................. 505/100, 230, 505/430, 433, 450; 29/599, 825; 174/125.1; 148/96, 514; 428/930; 423/289

(56) References Cited

U.S. PATENT DOCUMENTS

| | | | |
|---|---|---|---|
| 4,917,965 A | | 4/1990 | Inoue et al. |
| 6,511,943 B1 | * | 1/2003 | Serquis et al. .............. 505/300 |
| 6,514,557 B2 | * | 2/2003 | Finnemore et al. ............ 427/62 |
| 6,586,370 B1 | * | 7/2003 | Holcomb ..................... 505/236 |
| 6,591,119 B2 | * | 7/2003 | Finnemore et al. .......... 505/230 |
| 6,626,995 B2 | * | 9/2003 | Kim et al. ................... 117/101 |
| 6,630,427 B2 | * | 10/2003 | Dunand ....................... 505/452 |
| 6,687,975 B2 | * | 2/2004 | Tomsic ......................... 29/599 |

OTHER PUBLICATIONS

Single crystal MgB2 with anisotropic superconducting properties, by M. Xu et al, Los Alamos National Laboratory, Preprint Archive, May 2001, pp. 1–6.

Superconductivity at 39 K in magnesium diboride, by Jun Nagamatsu et al, NATURE, vol. 410, Mar. 2001, pp. 63–65.

Review of superconducting properties of MgB2, by C. Buzea et al, Superconductor Science and Technology, vol. 14, No. 11, Nov. 2001, pp. 115–146.

* cited by examiner

*Primary Examiner*—Stanley S. Silverman
*Assistant Examiner*—Colleen P. Cooke
(74) *Attorney, Agent, or Firm*—Flynn, Thiel, Boutell & Tanis, P.C.

(57) ABSTRACT

The invention is intended to establish means for manufacturing $MB_2$ single crystals and to provide a useful superconductive material (wire rod and so forth) taking advantage of anisotropic superconductive properties thereof. A mixed raw material of Mg and B or a precursor containing $MgB_2$ crystallites, obtained by causing reaction of the mixed raw material of Mg and B, kept in contact with hexagonal boron nitride (hBN), is held at a high temperature in the range of 1300 to 1700° C. and under a high pressure in the range of 3 to 6 GPa to cause reaction for forming an intermediate product, thereby growing the $MB_2$ single crystals having anisotropic superconductive properties via the intermediate product. The single crystals have features such that, depending on a direction in which a magnetic field is applied thereto, an irreversible magnetic field strength becomes equivalent to not less than 95% of a second magnetic field strength, so that adjustment of crystal orientation thereof results in production of a superconductive material excellent in property. Further, it is useful in effecting growth of the single crystals to cause a reducing agent such as Mg and so forth to coexist at the time of the reaction, or to provide a temperature gradient in melt occurring in the course of the reaction.

8 Claims, 4 Drawing Sheets a = 3.0851(5) Å
c = 3.5201(5) Å

MGB2 SINGLE CRYSTAL AND ITS PRODUCTION METHOD, AND SUPERCONDUCTIVE MATERIAL CONTAINING MGB2 SINGLE CRYSTAL

TECHNICAL FIELD

The invention relates to an $MgB_2$ single crystal having anisotropic superconductive properties, a superconductive material containing the same, and a method of manufacturing the same, making it possible to provide a superconducting wire and superconductive thin film that are operatable at a relatively high temperature.

BACKGROUND TECHNOLOGY

Since it has recently been discovered that $MgB_2$, that is, magnesium boride is a superconductive substance having a relatively high critical temperature (Tc = about 39K), researches from various viewpoints have been conducted in order to elucidate its properties in detail. However, an $MgB_2$ material has been so far known only in the form of "fine powders" or "polycrystalline bulk material", and further, there has been reported no case concerning manufacture of an $MgB_2$ single crystal, so that satisfactory results of the researches have not been gained as yet.

A reason for difficulty encountered in growing a single crystal of $MgB_2$ lies in that, upon heating $MgB_2$ in an attempt to obtain first $MgB_2$ melt in order to cause growth of the single crystal thereof, there occurs a phenomenon causing $MgB_2$ to be decomposed into $MgB_4$ and $MgB_6$ at a temperature lower than the melting temperature of $MgB_2$.

Although there has been a report stating "a trace of $MgB_2$ that appeared like crystallites was detected as a byproduct upon synthesizing cubic boron nitride (cBN) from hexagonal boron nitride (hBN) under high pressure" (N. E. Flonenko et al. Dokl Akad. Nauk SSSR 175 (1967), pp. 833 to 836), details of the report are unknown, being far from contributing to elucidation of the properties of $MgB_2$ in detail.

Under the circumstances, it is an object of the invention to establish means for manufacturing $MgB_2$ single crystals, thereby opening a way to considerably expand applicable fields of $MgB_2$ that is highly hoped for as an excellent superconductive material.

DISCLOSURE OF THE INVENTION

To that end, the inventor et al. have conducted intensive researches, and as a result, the following knowledge has been obtained.

(a) As previously described, since $MgB_2$ is caused to be decomposed into $MgB_4$ and $MgB_6$ before $MgB_2$ is melted if the same in as-is state is heated at a high temperature, it has been impossible to obtain stable $MgB_2$ melt. However, if a mixed raw material of Mg and B or $MgB_2$ powders obtained by causing reaction of the mixed raw material of Mg and B, kept in contact with hexagonal boron nitride (hBN), respectively, is heated up under high pressure, this will generate $Mg_3BN_3$ that is a eutectic composition of Mg, B and N, and so forth, whereupon there occur regions where $Mg_3BN_3$ and so forth are turned into melt thereof at a temperature lower than the decomposition temperature of $MgB_2$ in an Mg-B2 constituent system, and if this state is kept, there occurs crystallization of $MgB_2$ crystals from the melt containing $Mg_3BN_3$ and so forth, thereby causing crystal growth of the $MgB_2$ crystals without occurrence of decomposition into $MgB_4$ and so forth.

(b) In this case, if the $MgB_2$ powders in non-melted state exist in the melt, these will act as nuclei for crystallization of the $MgB_2$ crystals, thereby causing crystal growth thereof, so that it becomes possible to grow relatively large crystals in shorter time.

(c) Further, if a reducing agent (such as Mg etc. having strong oxidizability) is caused to coexist in a reacting system in such a way as to be spatially separated from the mixed powders of Mg and B that are raw materials of $MgB_2$ crystals, the reducing agent will absorb oxygen that cannot be prevented from being mixed into the reacting system, thereby lowering a partial pressure of oxygen in the reacting system, so that growth of the $MgB_2$ crystals is facilitated, resulting in more stable growth of $MgB_2$ single crystals.

(d) In addition, if a temperature gradient is caused to occur in $Mg_3BN3$ melt occurring by heating up under high pressure, this will further promote the growth of the $MgB_2$ crystals.

(e) The $MgB_2$ single crystals obtained by the above-described method, and so forth, are of a hexagonal structure wherein two-dimensional boron atom layers and magnesium atom layers are alternately deposited on top of each other in the vertical direction, exhibiting pronounced anisotropy in respect of superconductive properties (for example, a second magnetic field $Hc_2$ in the case where a magnetic field is applied in such a way as to be parallel with boron faces thereof differs considerably from that in the case where the magnetic field is applied in such a way as to be perpendicular to the boron faces), so that it is possible to manufacture a kind of material capable of exhibiting superconductive properties of $MgB_2$ in the best state by forming a configuration wherein a plurality of the single crystals are bonded in such a way that respective crystal orientations thereof are aligned with each other.

(f) The lower the temperature of the $MgB_2$ single crystals is, or the higher the purity and crystallinity thereof are, the more pronounced the anisotropy in respect of superconductive properties of the $MgB_2$ single crystals becomes, however, with the method described in the foregoing, it is possible to obtain such high-purity $MgB_2$ single crystals as one having "an anisotropy ratio not less than 2.3 at a temperature of 25K", and in addition, this $MgB_2$ single crystals have a feature such that an irreversible magnetic field $H_{irr}$, is very close to a second magnetic field $Hc_2$ in the case where a magnetic field is applied thereto in such a way as to be parallel with the boron faces. Taking advantage of the feature, it is possible to manufacture a superconductive material and so forth that can allow large superconducting current to flow even if a high magnetic filed is applied thereto provided that the high magnetic filed is parallel with the boron faces, thus enabling applicable fields of MgB2 to be considerably expanded.

Herein the anisotropy ratio described above is defined by the following formula $$\text{anisotropy ratio} = \frac{Hc_2(H \,/\!/\, c)}{Hc_2(H \,/\!/\, ab)}$$

(g) Further, it is not that a kind of material capable of having the above-described superconductive properties based on the $MgB_2$ single crystals is not necessarily limited to material made up of the $MgB_2$ single crystals only, and any material can exhibit correspondingly excellent superconductive properties even if other substances (for example, Mg, B, and $MgB_2$ powders that have not reacted as yet) are mixed therein provided that the $MgB_2$ single crystals are included therein.

The invention has been developed on the basis of respective items of the knowledge described above, and is intended to provide a $MgB_2$ single crystal superconductor, and methods of manufacturing the same, as described under the following items (1) to (8), respectively.

(1) An $MgB_2$ single crystal having anisotropic superconductive properties such that a critical magnetic field anisotropy ratio at a temperature of 25K is not less than 2.3, and in the case where a magnetic field is applied thereto so as to be parallel with boron faces, an irreversible magnetic field strength is equivalent to not less than 95% of a second magnetic field strength.

(2) A method of manufacturing $MgB_2$ single crystals, comprising the steps of:

preparing a mixed raw material of Mg and B; heating and melting the mixed raw material, kept in contact with boron nitride (BN), at a high temperature in the range of 1300 to 1700° C. and under a high pressure in the range of 3 to 6 GPa; and causing growth of the $MgB_2$ single crystals having anisotropic superconductive properties by holding the mixed raw material in the above-described state.

(3) A method of manufacturing $MgB_2$ single crystals, comprising the steps of:

producing a precursor containing $MgB_2$ crystallites, obtained by causing reaction of a mixed raw material of Mg and B;

heating and melting the precursor, kept in contact with hexagonal boron nitride (hBN), at a high temperature in the range of 1300 to 1700° C. and under a high pressure in the range of 3 to 6 GPa; and causing growth of the $MgB_2$ single crystals having anisotropic superconductive properties by holding the precursor in the above-described state.

(4) The method of manufacturing $MgB_2$ single crystals, as set out under the above-described items 2 or 3, wherein in the course of heating, and melting the raw material or the precursor, to be heated and melted, at the high temperature and under the high pressure, and holding the same in the above-described state, a reducing agent is caused to coexist therewith.

(5) The method of manufacturing $MgB_2$ single crystals, as set out under any of the above-described items 2 to 4, wherein in the course of heating and melting the raw material or the precursor, to be heated and melted, at the high temperature and under the high pressure, and holding the same in the above-described state, a temperature gradient of from 150 to 300° C. is provided in melt occurring as a result of the heating and melting the raw material or the precursor.

(6) The method of manufacturing $MgB_2$ single crystals, as set out under any of the above-described items 2 to 5, wherein the $MgB_2$ single crystals have anisotropic superconductive properties which are superconductive properties such that a critical magnetic field anisotropy ratio at a temperature of 25K is not less than 2.3, and in the case where a magnetic field is applied thereto so as to be parallel with boron faces, an irreversible magnetic field strength is equivalent to not less than 95% of a second magnetic field strength.

(7) A superconductive material comprising $MgB_2$ single crystals having anisotropic superconductive properties such that a critical magnetic field anisotropy ratio at a temperature of 25K is not less than 2.3, and in the case where a magnetic field is applied thereto so as to be parallel with boron faces, an irreversible magnetic field strength is equivalent to not less than 95% of a second magnetic field strength.

(8) A superconductive wire rod comprising $MgB_2$ single crystals having anisotropic superconductive properties such that a critical magnetic field anisotropy ratio at a temperature of 25K is not less than 2.3, and in the case where a magnetic field is applied thereto so as to be parallel with boron faces, an irreversible magnetic field strength is equivalent to not less than 95% of a second magnetic field strength.

As described in the foregoing, with the invention, stable growth of $MgB_2$ single crystals can be attained by specifying conditions, and so forth, for implementing liquid state of $MgB_2$, so that the $MgB_2$ single crystals or a superconductive material comprising the $MgB_2$ single crystals, hoped for use in wide application fields, can be provided.

BEST MODE FOR CARRYING OUT THE INVENTION

Figure 1:
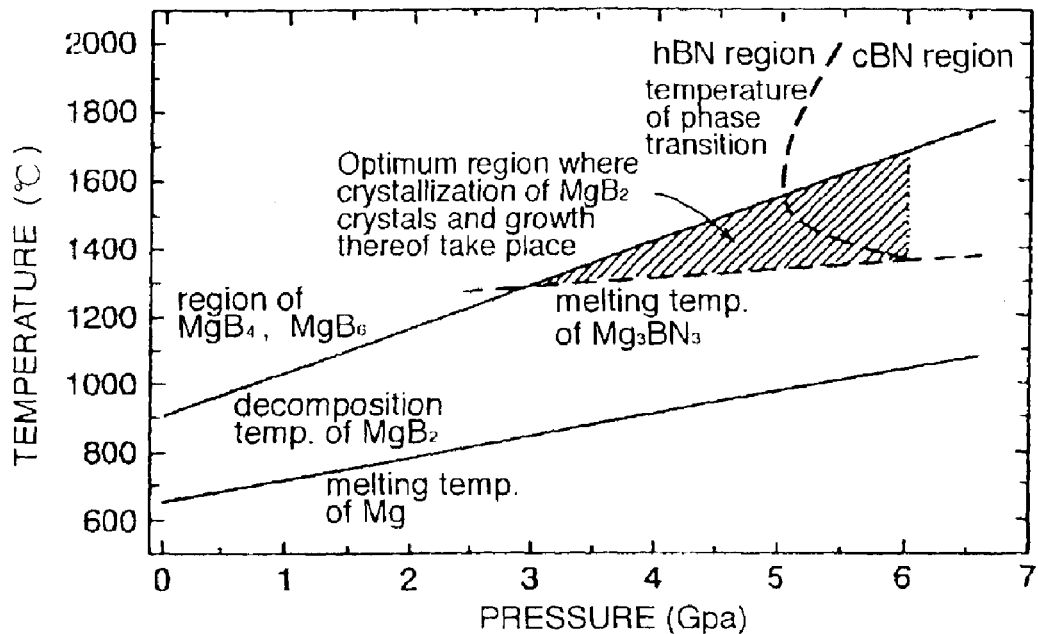
FIG. 1 is a graph showing optimum conditions for obtaining an $MgB_2$ single crystal.

An embodiment of the invention together with operation thereof is described in detail hereinafter.

An $MgB_2$ single crystal according to the invention has anisotropy in respect of its superconductive properties in a critical magnetic field and so forth, and by bonding together a plurality of such single crystals having anisotropy in respect of superconductive properties in such a way that respective crystal orientations thereof are aligned with each other, or by causing a plurality of such single crystals adjacent to each other to grow while controlling them in such a way that respective crystal orientations thereof are aligned with each other by use of a seed crystal, it is possible to make up "a superconductor capable of exhibiting anisotropic superconductive properties of $MgB_2$ in the best state".

Further, with the use of a method according to the invention, it is possible to obtain an $MgB_2$ single crystal exhibiting large anisotropy even at a relatively high temperature such that "a critical magnetic field anisotropy ratio at a temperature of 25K is not less than 2.3", so that an $MgB_2$ superconductor quite excellent in superconductive properties can be obtained by properly bonding the $MgB_2$ single crystals together.

Further, with the use of the method according to the invention, it is possible in addition to the above-described characteristic to obtain the $MgB_2$ single crystal wherein, in the case where a magnetic field is applied thereto so as to be parallel with boron faces, an irreversible magnetic field exhibits a value very close to that for a second magnetic field such that an irreversible magnetic field $H_{irr}$ is equivalent to not less than 95% of a second magnetic field $Hc_2$ in the case where the magnetic field is applied thereto so as to be parallel with the boron faces, so that it also becomes possible to provide a superconductor having a very wide region that allows current to flow therethrough although this is conditional on the magnetic field being applied thereto so as to be parallel with the boron faces.

Now, as previously described, since $MgB_2$ is caused to be decomposed into $MgB_4$ and $MgB_6$ before $MgB_2$ is melted if the same in an as-is state is heated at a high temperature, it has been impossible to obtain $MgB_2$ melt deemed necessary in order to cause growth of the $MgB_2$ single crystal. However, if "a mixed raw material of Mg and B" or "a precursor containing $MgB_2$ crystallites obtained by causing reaction of the mixed raw material of Mg and B", kept in contact with hexagonal boron nitride (hBN), is heated under high pressure, this will generate $Mg_3BN_3$ that is a eutectic composition of Mg, B and N, whereupon there occur regions where $Mg_3BN_3$ is turned into melt at a temperature lower than the decomposition temperature of $MgB_2$. Then, if the raw material is kept in the regions, there occurs crystallization of $MgB_2$ crystals from the melt of $Mg_3BN_3$, and crystal growth continues for relatively long hours without the $MgB_2$ crystals being decomposed into $MgB_4$ and so forth.

Thus, it becomes possible to obtain the $MgB_2$ single crystals, a case of which has not been reported in specific terms in the past.

FIG. 1 is a graph showing optimum conditions (temperature, pressure) for obtaining the $MgB_2$ single crystal, diagramming relationship between pressure, and the melting temperature of Mg, the decomposition temperature of $MgB_2$, the melting temperature of $Mg_3BN_3$, and the temperature of phase transition from hBN (hexagonal BN) to cBN (cubic BN), respectively.

In FIG. 1, upon continuation of pressurization and heating of a mixed raw material of Mg and B", kept in contact with hexagonal boron nitride (hBN), there occurs generation of $MgB_2$ (in powdery form) in regions of relatively low temperature and low pressure due to reaction between Mg and B, however, such $MgB_2$ undergoes decomposition into $MgB_4$ and $MgB_6$ in regions of low pressure when applied temperature is raised. Upon pressure reaching not lower than 3 GPa, and temperature reaching not lower than 1300° C., however, a eutectic composition $Mg_3BN_3$ is generated in the presence of BN, thereby turning into a melt phase. If the melt phase is maintained at a temperature lower than the decomposition temperature of $MgB_2$, this will cause crystallization of $MgB_2$ from the $Mg_3BN_3$ melt, and an $MgB_2$ crystal undergoes crystal growth without being decomposed into $MgB_4$ and $MgB_6$.

In the region of cBN, however, there occurs a state where concurrent growth of $MgB_2$ crystals and cBN crystals of a cubic system proceeds, allowing existence of $MgB_2$ as an intermediate product in the course of transformation from $Mg_3BN_3$ to cBN. Accordingly, in a high-pressure region exceeding 6 GPa, reaction of transformation from $Mg_3BN_3$ to cBN proceeds without hardly any pause as is evident from FIG. 1, so that actual work for such processing lacks practicality because a processing time range for taking out the $MgB_2$ crystals is extremely short.

For this reason, in the manufacture of the $MgB_2$ crystals, it is preferable to adopt conditions such that mixed raw material powders of Mg and B are sealed in a high-pressure capsule made of BN, and are heated at a temperature in the range of 1300 to 1700° C. and under a high pressure in the range of 3 to 6 GPa (preferably 3.5 to 6 GPa).

In this case, if $MgB_2$ crystallites in non-melted state exist in $Mg_3BN_3$ melt, the $MgB_2$ crystallites act as nuclei, promoting crystallization and growth of $MgB_2$ crystals, and accordingly, it is also recommendable to adopt a process comprising steps of preparing a precursor containing $MgB_2$ crystallites, obtained by causing reaction of a mixed raw material of Mg and B in advance at an approximately intermediate temperature under an intermediate pressure (for example, at 900° C. and under pressure in the range of about 2 to 4 GPa), and holding the precursor, in a state where it is kept in contact with hexagonal boron nitride (hBN), at a temperature in the range of 1300 to 1700° C. and under a high pressure in the range of 3 to 6 GPa.

Further, it is deemed appropriate that an oxygen partial pressure should be kept constant in the course of crystal growth because an equilibrium partial pressure of a B—N—Mg system is caused to undergo a change due to reaction of oxygen itself therewith, however, it is extremely difficult to prevent oxygen from being mixed in throughout works for mixing and sealing of raw materials, and so froth. Accordingly, a reducing agent such as Mg and so forth, and the mixed raw material powders of Mg and B are preferably caused to coexist while both are separated spatially from each other in an atmosphere of heating raw materials for manufacturing single crystals. The reducing agent that is caused to coexist will react with a trace of oxygen mixed into the heating atmosphere, thereby fulfilling the function of assisting growth of the $MgB_2$ crystals.

Preferable as the reducing agent is a metallic material having strong oxidizability, such as Mg, etc. that will not be precipitated as an impurity since it is one of constituent elements of a target product.

Further, it is also recommendable to cause a temperature gradient of from 150 to 300° C. to occur in the $Mg_3BN_3$ melt occurring as a result of heating and holding raw materials for manufacturing the $MgB_2$ single crystals, kept in contact with hexagonal boron nitride (hBN), when heating and holding said raw materials. By so doing, crystal growth can be promoted although there arise worries that crystal growth takes longer time at a temperature below 150° C. of the temperature gradient while growth of large and high-purity single crystals becomes unstable at a temperature in excess of 300° C.

Needless to say, in providing the melt for crystal growth with the temperature gradient, a temperature gradient that tends to occur unintentionally between the central part of a reactor and end parts, and so forth, thereof may be utilized as it is.

Incidentally, when forming a superconductive material for practical application (for example, a superconducting wire rod) by taking advantage of the properties of the above-described $MgB_2$ single crystals, other materials such as Mg, B, $MgB_2$ powders, etc. that have not reacted as yet tend to be mixed in, however, it goes without saying that appropriate superconductive properties based on the $MgB_2$ single crystals can be obtained even if such materials are mixed in.

Further, it also goes without saying that appropriate superconductive properties can be obtained even if metal such as Ag, Cu, and so forth is used as a binder to facilitate formation of, for example, a wire rod when forming the wire rod from an $MgB_2$ single crystal material.

Subsequently, the invention is described in more specific terms with reference to an embodiment thereof.

EMBODIMENT

First, Mg powders of 100 mesh in grain size, and B powders (amorphous powders about 0.91 µm in grain diameter) were mixed with each other so as to have an atomic ratio of "Mg: B=1:2", and a mixture was compression-molded into compacts each 5 mm in diameter, and 4 mm in thickness.

Further, separately from the compacts, there were prepared "BN pellets" and "compacts of Mg powders (reducing agent)", equivalent in dimensions to the compacts.

Figure 2:
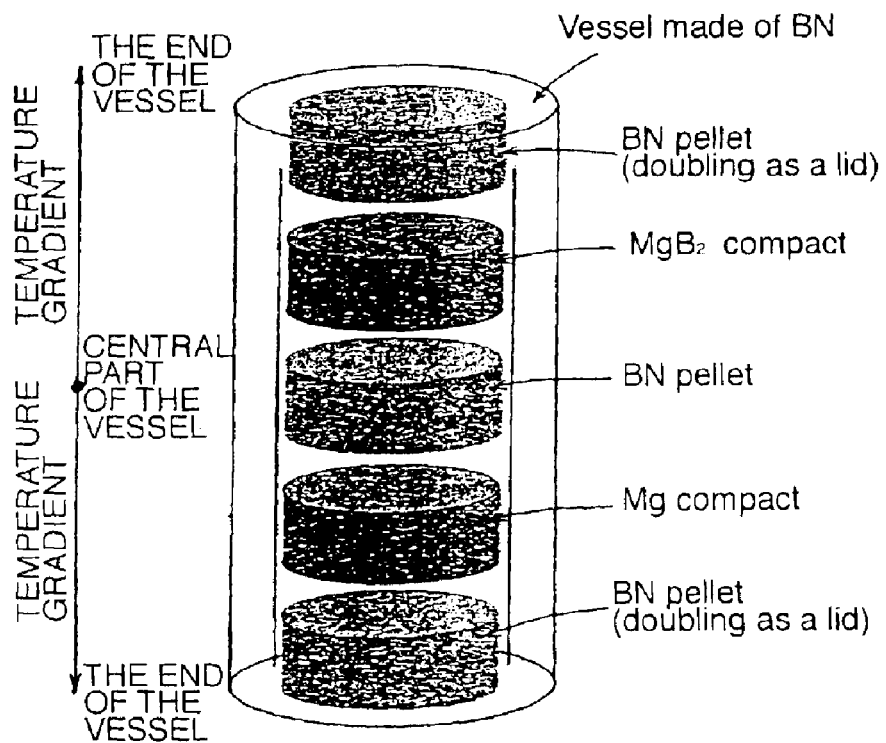
FIG. 2 is a schematic illustration showing a manner in which raw materials for $MgB_2$ single crystals according to an embodiment of the invention are sealed into a vessel made of hBN.

Subsequently, as shown in FIG. 2, these were sealed into a cylindrical vessel (high-pressure vessel 5 mm in inside diameter and 10 mm in length), made of hexagonal BN, in the atmosphere (BN pellets were disposed at both ends of the vessel, respectively, doubling as respective lids).

Then, in a first stage, in order to produce a precursor containing $MgB_2$ crystallites by causing reaction of mixed powders of Mg and B, pressure was applied to the interior of the vessel made of BN so as to reach 5 GPa while heating the vessel at 900° C. for 15 minutes.

Subsequently, the interior of the vessel made of BN, maintaining a pressurized condition at 5 GPa, was further heated up to a temperature of 1500° C., which condition was held for 25 minutes, thereby attempting to implement growth of $MgB_2$ single crystals.

Further, at this point in time, a temperature gradient of 210° C. between the central part of the vessel made of BN and the respective ends thereof (the temperature gradient indicated by the respective arrows in FIG. 2) was caused to occur in $Mg_3BN_3$ melt that was produced in the vessel made of BN.

Figure 3:
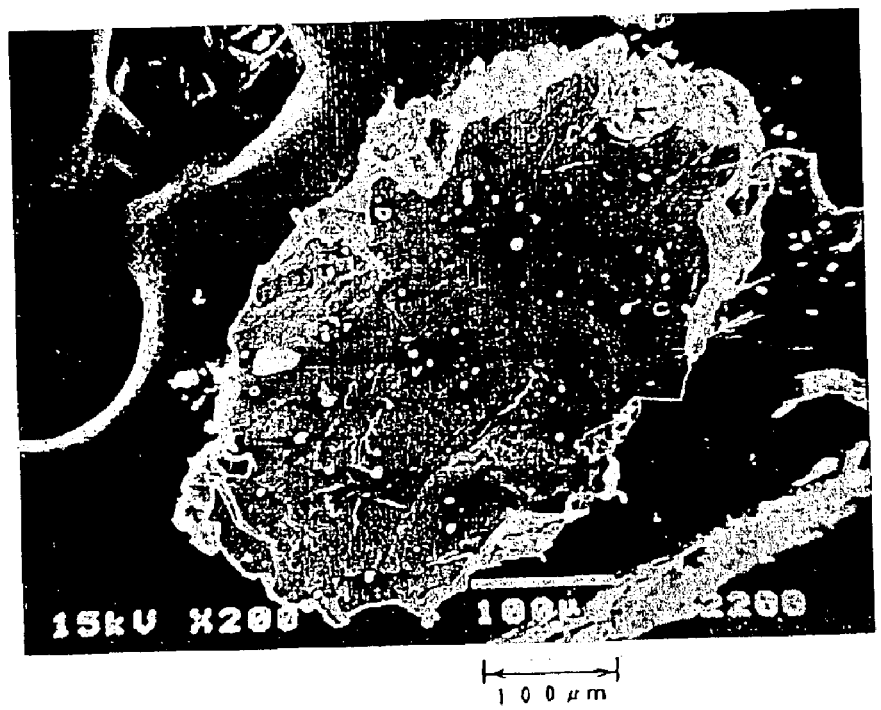
FIG. 3 is a scanning electron micrograph of the $MgB_2$ single crystal according to the embodiment of the invention.
Figure 4:
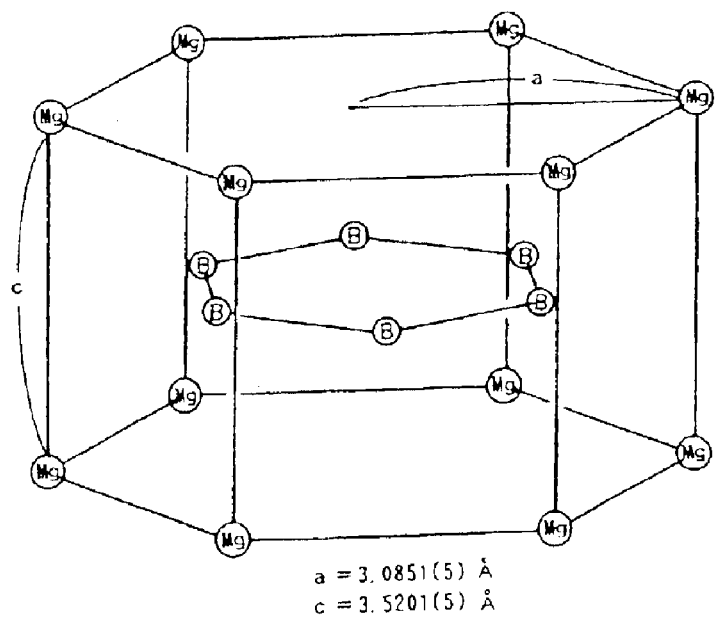
FIG. 4 is a schematic diagram of the crystal structure of material obtained according to the embodiment as confirmed based on a precision structural analysis by four-axial X-ray diffraction.

Upon observation of material inside the vessel made of BN after completion of such processing as described above with the use of an electron microscope, it was confirmed that crystals each on the order of 0.5 mm in size were obtained as shown in FIG. 3, and the crystals were $MgB_2$ single crystals of a hexagonal system structure as shown in FIG. 4 as a result of a precision structural analysis conducted by X-ray diffraction.

Figure 5:
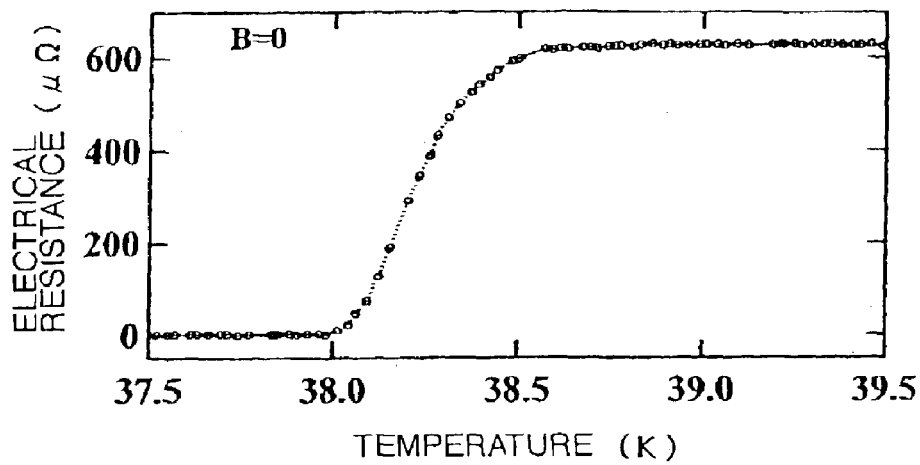
FIG. 5 is a graph showing relationship between temperature and electrical resistance with respect to the $MgB_2$ single crystal according to the embodiment.
Figure 6:
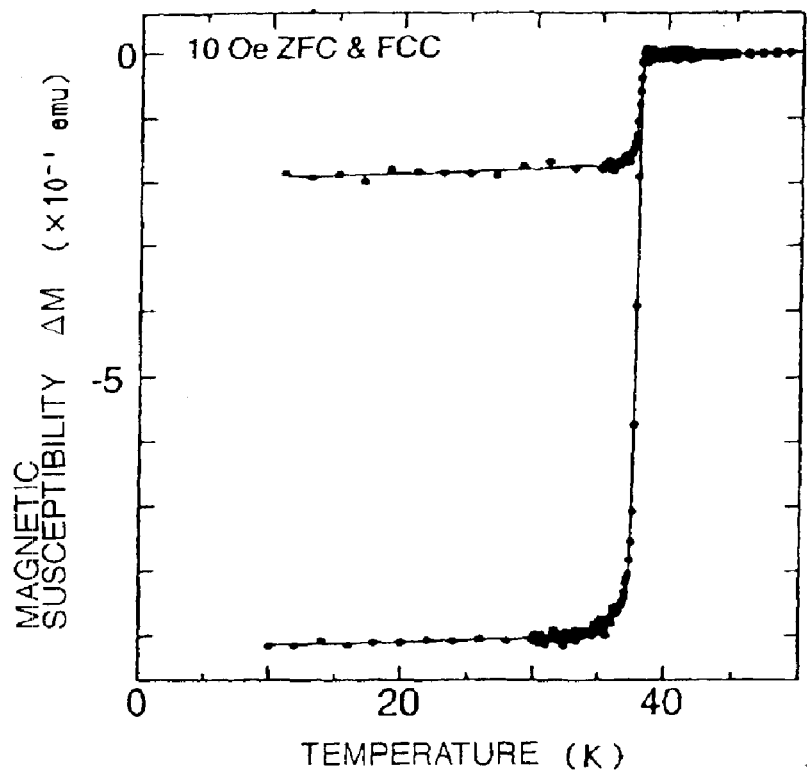
FIG. 6 is a graph showing relationship between temperature and magnetic susceptibility with respect to the $MgB_2$ single crystal according to the embodiment.

FIGS. 5 and 6 show relationship between temperature and electrical resistance, and relationship between temperature and a magnetic susceptibility ratio, based on the results of examination on the $MgB_2$ single crystals, respectively, and it can be confirmed from any of the figures that transition to superconductivity occurs at around 38K.

Figure 7:
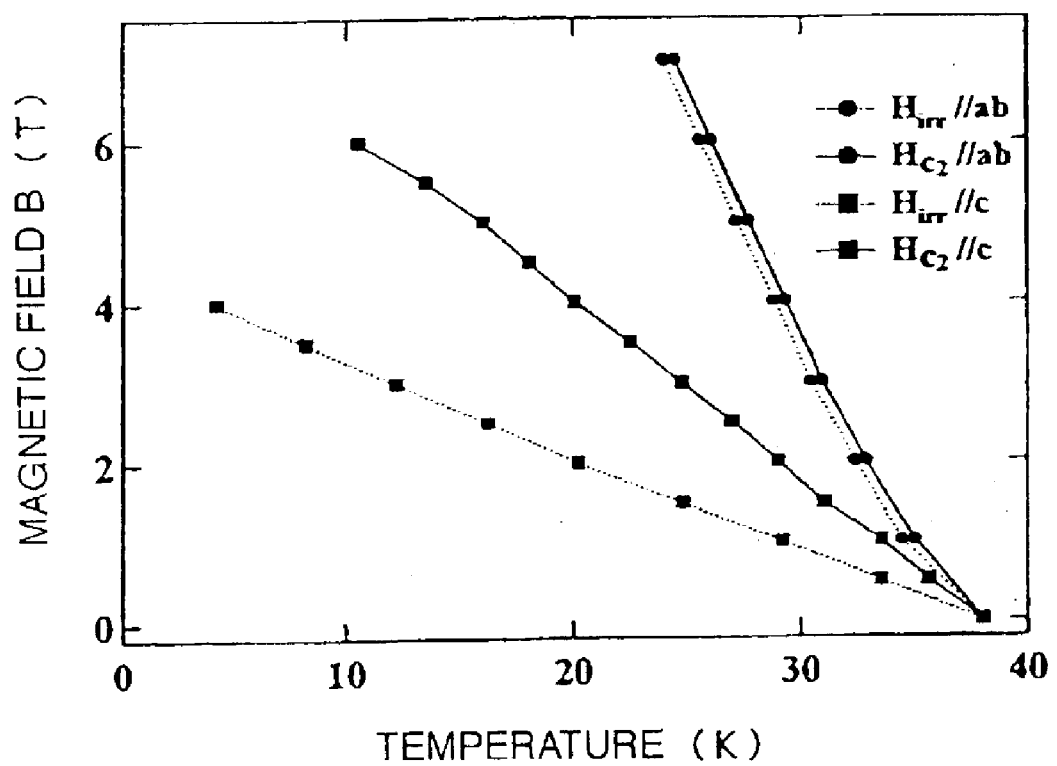
FIG. 7 is a graph showing temperature-dependency of a second magnetic field $Hc_2$ and that of an irreversible magnetic field $H_{irr}$, found from electrical resistance measurement, respectively, with respect to the $MgB_2$ single crystal according to the embodiment.

Further, with reference to the $MgB_2$ single crystal, temperature-dependency of a second magnetic field $Hc_2$ and that of an irreversible magnetic field $H_{irr}$, found from electrical resistance measurement, respectively, were sorted out, and are shown in FIG. 7.

As shown FIG. 7, the temperature-dependency of the second magnetic field $Hc_2$ and that of the irreversible magnetic field $H_{irr}$, in the case (B//ab) where a magnetic field is applied in such a way as to be parallel with boron faces, respectively, differ considerably from those in the case (B//c) where the magnetic field is applied in such a way as to be perpendicular to the boron faces, and at 25K, an anisotropy ratio of the second magnetic field $Hc_2$, becomes 2.3 or greater.

Now, with reference to the $MgB_2$ single crystal, there has been observed a feature in that when a magnetic field is applied in such a way as to be parallel with the boron faces (H//ab), the irreversible magnetic field $H_{irr}$ is extremely close to the second magnetic field $Hc_2$ ($H_{irr} \approx Hc_2$) (refer to FIG. 7). In this connection, it is to be pointed out that, in the case where the magnetic field is applied in such a way as to be perpendicular to the boron faces (H//c), $H_{irr}$ is substantially equivalent to only half of $Hc_2$.

A superconductor generally maintains a superconductive state in a magnetic field whose strength is less than that of a second magnetic field $Hc_2$, however, in a magnetic field whose strength is grater than that of an irreversible magnetic field $H_{irr}$, there occurs flux motion inside the superconductor, thereby causing generation of resistance, so that flow of superconducting current is stopped. In other words, it follows that a region where current can flow is very wide if the irreversible magnetic field $H_{irr}$ is extremely close to the second magnetic field $Hc_2$ ($H_{irr} \approx Hc_2$).

Thus, the $MgB_2$ single crystal is an extremely advantageous superconductive material firm an industrial point of view that can allow large superconducting current to flow even if a high magnetic filed is applied thereto provided that the high magnetic filed applied is parallel with the boron faces.

INDUSTRIAL APPLICABILITY

The invention can not only stably supply an $MgB_2$ single crystal having a specific anisotropy in its superconductive properties, and can manufacture a superconductive material excellent in superconductive properties, containing the $MgB_2$ single crystal, but also contribute to providing useful information for selection of a process for manufacturing $MgB_2$ superconducting wire rods and thin films. Accordingly, the invention can make great contribution to expansion of application for $MgB_2$ that is highly hoped for as a superconductive material having high utilization.

What is claimed is:

1. An $MgB_2$ single crystal having anisotropic superconductive properties such that a critical magnetic field anisotropy ratio at a temperature of 25K is not less than 2.3, and in the case where a magnetic field is applied thereto so as to be parallel with boron faces, an irreversible magnetic field strength is equivalent to not less than 95% of a second magnetic field strength.

2. A method of manufacturing $MgB_2$ single crystals, comprising the steps of:

preparing a mixed raw material of Mg and B;

heating and melting the mixed raw material, kept in contact with boron nitride (hBN), at a high temperature in the range of 1300 to 1700° C. and under a high pressure in the range of 3 to 6 GPa; and causing growth of the $MgB_2$ single crystals having anisotropic superconductive properties by holding the mixed raw material in the above-described state.

3. A method of manufacturing $MgB_2$ single crystals, comprising the steps of:

producing a precursor containing $MgB_2$ crystallites, obtained by causing reaction of a mixed raw material of Mg and B;

heating and melting the precursor, kept in contact with hexagonal boron nitride (hBN), at a high temperature in the range of 1300 to 1700° C. and under a high pressure in the range of 3 to 6 GPa; and causing growth of the $MgB_2$ single crystals having anisotropic superconductive properties by holding the precursor in the above-described state.

4. The method of manufacturing $MgB_2$ single crystals, according to claim 2, wherein in the course of heating, and melting the raw material or the precursor, to be heated and melted, at the high temperature and under the high pressure, and holding the same in the above-described state, a reducing agent is caused to coexist therewith.

5. The method of manufacturing $MgB_2$ single crystals, according to claim 2, wherein in the course of heating and melting the raw material or the precursor, to be heated and melted, at the high temperature and under the high pressure, and holding the same in the above-described state, a temperature gradient of from 150 to 300° C. is provided in melt occurring as a result of the heating and melting the raw material or the precursor.

6. The method of manufacturing $MgB_2$ single crystals, according to claim 2, wherein the $MgB_2$ single crystals have anisotropic superconductive properties which are superconductive properties such that a critical magnetic field anisotropy ratio at a temperature of 25K is not less than 2.3, and in the case where a magnetic field is applied thereto so as to be parallel with boron faces, an irreversible magnetic field strength is equivalent to not less than 95% of a second magnetic field strength.

7. A superconductive material comprising $MgB_2$ single crystals having anisotropic superconductive properties such that a critical magnetic field anisotropy ratio at a temperature of 25K is not less than 2.3, and in the case where a magnetic field is applied thereto so as to be parallel with boron faces, an irreversible magnetic field strength is equivalent to not less than 95% of a second magnetic field strength.

8. A superconductive wire rod comprising $MgB_2$ single crystals having anisotropic superconductive properties such that a critical magnetic field anisotropy ratio at a temperature of 25K is not less than 2.3, and in the case where a magnetic field is applied thereto so as to be parallel with boron faces, an irreversible magnetic field strength is equivalent to not less than 95% of a second magnetic field strength.

* * * * *